(12) United States Patent
Hsiao

(10) Patent No.: US 7,447,290 B2
(45) Date of Patent: Nov. 4, 2008

(54) APPARATUS OF PHASE-FREQUENCY DETECTOR

(75) Inventor: Yuan-Kun Hsiao, Taipei Hsien (TW)

(73) Assignee: Tian Holdings, LLC, Wilmington, DE (US)

( * ) Notice: Subject to any disclaimer, the term of this patent is extended or adjusted under 35 U.S.C. 154(b) by 830 days.

(21) Appl. No.: 10/709,026

(22) Filed: Apr. 7, 2004

(65) Prior Publication Data
US 2005/0025275 A1 Feb. 3, 2005

Related U.S. Application Data

(60) Provisional application No. 60/461,578, filed on Apr. 10, 2003.

(51) Int. Cl.
*H03D 3/24* (2006.01)
(52) U.S. Cl. .................. 375/375; 375/215; 375/371; 375/376; 327/3; 327/5; 327/7; 327/156; 369/44.13; 369/44.26
(58) Field of Classification Search .................. 375/326, 375/362, 371, 373, 375–376, 315, 354; 327/113, 327/3, 5, 7, 12, 156; 455/130, 214; 369/44.13, 369/44.26, 44.28, 47, 275.4
See application file for complete search history.

(56) References Cited

U.S. PATENT DOCUMENTS

| | | | |
|---|---|---|---|
| 4,999,824 A | | 3/1991 | Fuji et al. |
| 5,475,666 A | | 12/1995 | Ito et al. |
| 5,689,482 A | | 11/1997 | Iida |
| 6,088,307 A | * | 7/2000 | Fushimi et al. ........... 369/44.13 |
| 6,285,219 B1 | * | 9/2001 | Pauls ........................... 327/3 |
| 6,333,902 B1 | | 12/2001 | Shim |
| 6,345,023 B1 | | 2/2002 | Fushimi et al. |
| 6,587,417 B2 | | 7/2003 | Okamoto |
| 6,661,752 B2 | | 12/2003 | Eom |
| 6,754,147 B2 | | 6/2004 | Hsu |

(Continued)

FOREIGN PATENT DOCUMENTS

CN 1373474 A 10/2002

(Continued)

*Primary Examiner*—Shuwang Liu
*Assistant Examiner*—Hirdepal Singh
(74) *Attorney, Agent, or Firm*—Perkins Coie LLP

(57) ABSTRACT

An apparatus of phase-frequency detector for adjusting wobble clock signal and wobble signal in the same phase, comprising: a first logic gate, receiving a first protection signal and a second protection signal and outputting a third protection signal according to a logic operation; a first flip-flop, coupled to the first logic gate, outputting the third protection signal as a first output signal when the wobble clock trigger; a second flip-flop, coupled to the first logic gate, outputting the third protection signal as a second output signal when the wobble signal trigger; a second logic gate, coupled to the first and the second flip-flop, outputting a fourth protection signal according to a logic operation; a third logic gate, coupled to the second logic gate, receiving the third and the fourth protection signal, and outputting a fifth protection signal according to a logic operation; and a control signal generator, receiving the wobble clock, the input signal, and the fifth protection signal and determining whether adjusting the phase of the wobble signal and the wobble clock according to the logic level of the fifth protection signal.

21 Claims, 3 Drawing Sheets

U.S. PATENT DOCUMENTS

| | | | |
|---|---|---|---|
| 6,765,861 B2 | 7/2004 | Van Vlerken | |
| 6,785,207 B2 | 8/2004 | Nishimura et al. | |
| 6,891,785 B2 | 5/2005 | Yamamoto et al. | |
| 6,956,800 B2 | 10/2005 | Tanaka | |
| 7,003,065 B2 * | 2/2006 | Homol et al. | 375/376 |
| 7,016,277 B2 | 3/2006 | Chou | |
| 7,046,598 B2 | 5/2006 | Eom | |
| 7,053,919 B2 | 5/2006 | Nagano | |
| 7,190,906 B2 * | 3/2007 | Cao | 398/155 |
| 2002/0131347 A1 | 9/2002 | Raaymakers | |
| 2003/0043714 A1 | 3/2003 | Takeda | |
| 2003/0081531 A1 | 5/2003 | Mashimo et al. | |
| 2003/0179665 A1 | 9/2003 | Iwazawa | |
| 2004/0141577 A1 * | 7/2004 | Brunn et al. | 375/376 |
| 2004/0178834 A1 * | 9/2004 | Lee | 327/156 |
| 2004/0213119 A1 | 10/2004 | Van Vlerken et al. | |
| 2005/0073923 A1 | 4/2005 | Tobita | |

FOREIGN PATENT DOCUMENTS

| | | |
|---|---|---|
| JP | 11-353686 | 12/1999 |

* cited by examiner

APPARATUS OF PHASE-FREQUENCY DETECTOR

BACKGROUND OF INVENTION

1. Field of the Invention

The invention relates to an optical disc drive for controlling a wobble clock signal and a method thereof, and more particularly, to an optical disc drive which utilizes a protection mechanism to prevent the phase-frequency detector from wrongly determining a phase difference between the phase of the wobble clock and the phase of the wobble signal, and the method thereof.

2. Description of the Prior Art

In present day information society, storage of large amounts of information has become a major problem. Of all types of storage medium, the optical disc is one of the most useful mediums because of its high storage capacity and small physical volume. However, as multimedia technology progresses increased storage requirements are required, and the storing capacity of a normal CD optical disc (650 MB) is becoming increasingly less satisfactory. Therefore, a new optical disc standard, the digital versatile disc (DVD), with increased storage capacity has emerged. The physical size of a DVD is almost identical to that of a CD; however, the storage capacity of a DVD is much larger than that of a CD.

Up until recently, the DVD functioned only as a read-only multi-function digital disc; however, similar to the progress of CD-R and CD-RW discs and their ability to easily carry needed data, standards of the writable multi-function digital disc and the rewritable multi-function digital disc have been created. This enables users to utilize DVD-R and DVD-RW multi-function digital discs to store great amounts of data, in a manner similar to one used with the CD and CD-RW discs. As known by those skilled in the art, the writable multi-function digital disc and the rewritable multi-function digital disc can be divided into many standards, such as DVD+R multi-function digital disc and DVD+RW multi-function digital disc, which can be used in a common DVD-video player or a common DVD-ROM drive.

In order to manage the stored data, areas for storing data in the multi-function digital disc are divided into many frames, as they are in CD discs. The information of the multi-function digital disc is stored in every frame according to a certain regulation. Therefore, when writing information into a writable multi-function digital disc, the optical disc drive has to ensure the regulation of each frame of the multi-function digital disc so that data can be correctly written into the writable multi-function digital disc. For storing related information of each frame, multi-function digital disc has a special physical structure for addressing stored data. For a DVD+R writable multi-function digital disc or a DVD+RW rewritable multi-function digital disc, the information is an address in pregroove (ADIP). As known by those skilled in the art, the DVD+R disc and the DVD+RW disc both have wobble tracks to store the above-mentioned ADIP. Therefore, the DVD+R disc drive and the DVD+RW disc drive can read the wobble track to generate the wobble signal. Because the wobble signal stores the ADIP through phase modulation, the DVD+R disc drive and DVD+RW disc drive firstly have to generate a corresponding non-phase modulation wobble clock according to the wobble signal for a ADIP decoder to decode the wobble signal to obtain needed ADIP. In other words, if the wobble signal is unstable, the ADIP decoder cannot read needed ADIP from the wobble signal smoothly.

SUMMARY OF INVENTION

It is therefore a primary objective of the claimed invention to provide a phase-frequency detector for adjusting a wobble clock and a wobble signal in the same phase to solve the above-mentioned problem.

According to an exemplary embodiment of the claimed invention, a phase-frequency detector for adjusting a target clock signal and an input signal to the same phase, the phase-frequency detector comprises: a first logic gate for receiving a first protection signal and a second protection signal, and for outputting a third protection signal according to a result of a corresponding logic arithmetic; a first flip-flop electrically connected to the first logic gate, the first flip-flop for receiving the third protection signal and for outputting the third protection signal as a first output signal when triggered by the target clock signal; a second flip-flop electrically connected to the first logic gate, the second flip-flop for receiving the third protection signal and for outputting the third protection signal as a second output signal when triggered by the target clock signal; a second logic gate electrically connected to the first flip-flop and the second flip-flop, the second logic gate for receiving the first output signal and the second output signal, and for outputting a fourth protection signal according to a result of a corresponding logic arithmetic; a third logic gate electrically connected to the second logic gate, the third logic gate for receiving the third protection signal and the fourth protection signal, and for outputting a fifth protection signal according to a result of a corresponding logic arithmetic; and a control signal generator for receiving the target clock signal, the input signal and the fifth protection signal, and for determining whether to compare the phase of the input signal and the phase of the target clock signal according to a logic level of the fifth protection signal; wherein when the control signal corresponds to a first logic level, the comparison of the phase of the input signal and the phase of the target clock signal is stopped, and when the control signal corresponds to a second logic level, the phase of the input signal is compared to the phase of the target clock signal for outputting a voltage control signal to adjust the target clock signal and the input signal to the same phase.

In addition, A phase-frequency detector for adjusting a target clock signal and an input signal to the same phase comprises: a first logic gate for receiving a first protection signal and a second protection signal, and for outputting a third protection signal according to a result of a corresponding logic arithmetic; a first flip-flop electrically connected to the first logic gate, the first flip-flop for receiving the third protection signal, and for outputting the third protection signal as a first output signal when triggered by the target clock signal; a second flip-flop electrically connected to the first logic gate, the second flip-flop for receiving the third protection signal, and for outputting the third protection signal as a second output signal when triggered by the input signal; a second logic gate electrically connected to the first flip-flop and the second flip-flop, the second logic gate for receiving the first output signal and the second output signal, and for outputting a fourth protection signal according to a result of a corresponding logic arithmetic; and a third logic gate electrically connected to the second logic gate, the third logic gate for receiving the third protection signal and the fourth protection signal, and for outputting a fifth protection signal according to a result of a corresponding logic arithmetic; wherein a logic level of the fifth protection signal is used to determine whether to compare the phase of the input signal and the phase of the target clock signal.

Further in addition, a phase-frequency detecting method for adjusting a target clock signal synchronous to an input signal, the phase-frequency detecting method comprises: executing a first logic arithmetic on a first protection signal and a second protection signal for outputting a third protection signal; outputting the third protection signal to form a first output signal when triggered by the target clock signal; outputting the third protection signal to form a second output signal when triggered by the input signal; executing a second logic arithmetic on the first output signal and the second output signal for outputting a fourth protection signal; executing a third logic arithmetic on the third protection signal and the fourth protection signal for outputting a fifth protection signal; and determining whether or not to compare the phase of the input signal and the phase of the target clock signal according to a logic level of the fifth protection signal.

The DVD+R disc drive or the DVD+RW disc drive according to the present invention are utilized in a clock generator with a protection mechanism, which can delay a reset time of a protection signal so that the protection mechanism can prevent the phase-frequency detector from wrongly determining the phase relationship between the wobble clock and the wobble signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
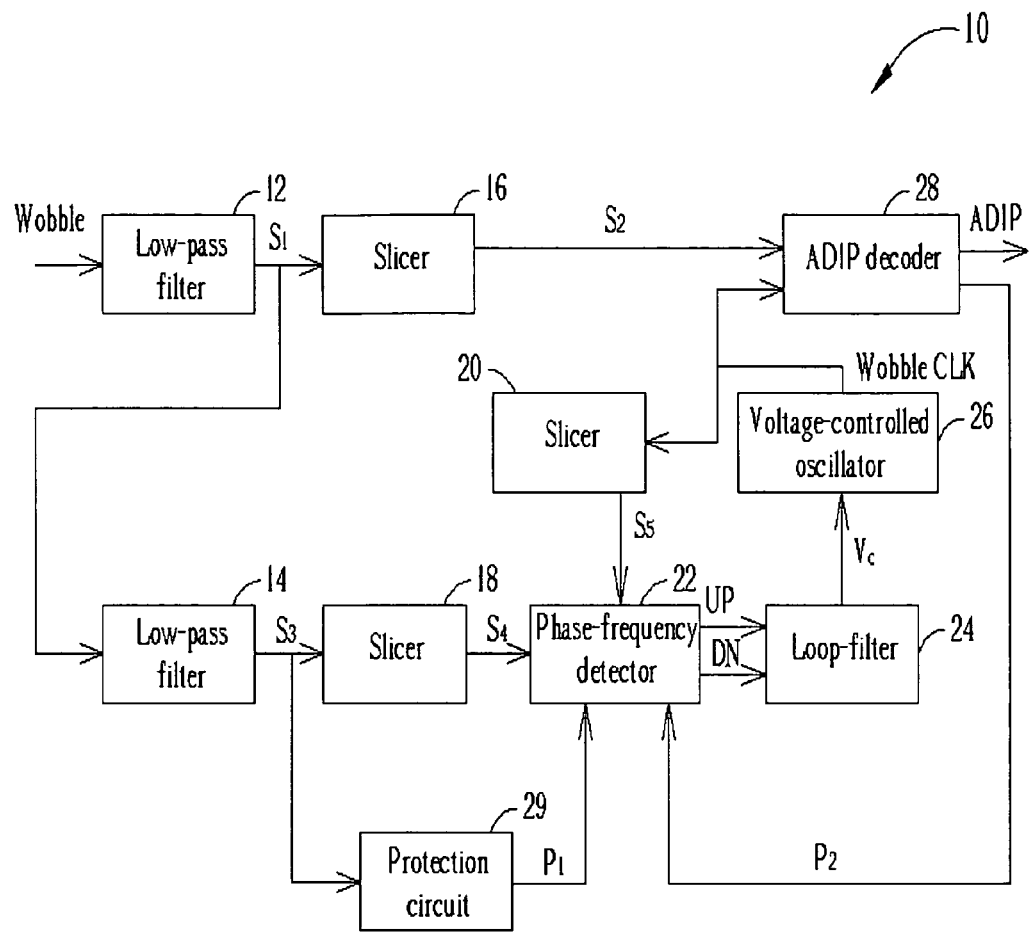
FIG. 1 is a block diagram of an optical disc drive according to the present invention.

Please refer to FIG. 1, which is a block diagram of an optical disc drive 10 according to the present invention. The optical disc drive 10 comprises a plurality of low-pass filters (LPF) 12, 14, a plurality of slicers 16, 18, 20, a phase-frequency detector (PFD) 22, a loop filter 24, a voltage-controlled oscillator (VCO) 26, an ADIP decoder 28, and a protection circuit 29. As known by those skilled in the art, the ADIP is stored in the wobble signal Wobble through phase modulation. Every two frames corresponds to 93 wobbles, where 8 wobbles are used to store the ADIP through phase-modulation. Therefore, the optical disc drive 10 has to first generate a non-phase-modulated wobble clock, WobbleCLK according to the phase-modulated wobble signal Wobble. After the non-phase-modulated wobble clock WobbleCLK is generated, the optical disc drive 10 can then obtain logic values corresponding to the phase-modulated part of the wobble signal Wobble by an XOR logic arithmetic execution on the wobble clock WobbleCLK and the wobble signal Wobble.

In generating the wobble clock WobbleCLK, the wobble signal Wobble is first processed by a low-pass filter 12 to form an output signal S1. Then the output signal S1 is transformed into a square-wave output signal S2 by a slicer 16. Furthermore, the output signal S1 is inputted into another low-pass filter 14 and transformed into an output signal S3. Please note that the low-pass filter 12 has a low Q factor, and the low-pass filter 14 has a high Q factor. Following this, the output signal S3 is transformed into a square-wave output signal S4 by the slicer 18.

The phase-frequency detector 22, the loop filter 24, the voltage-controlled oscillator 26, and the slicer 20 can be regarded as a clock generator for generating needed wobble clock WobbleCLK. As shown in FIG. 1, when the voltage-controlled oscillator 26 receives a control voltage Vc, the VCO 26 generates the wobble clock WobbleCLK, which is sent to the ADIP decoder 28 according to the voltage level of the control voltage Vc. Simultaneously, the wobble clock WobbleCLK is transformed into a square-wave output signal S5 by the slicer 20. Then, the phase-frequency detector 22 determines the phase difference between the output signal S5 and the output signal S4 and generates the control signal UP or DN, which is sent to the loop filter 24 according to the phase difference. At last, the loop filter 24 outputs the control voltage Vc to the VCO 26 according to the control signals DN and UP such that the frequency of the wobble clock WobbleCLK is adjusted.

In general, the loop filter 24 comprises a charge pump to adjust the control voltage Vc according to the control signals UP and DN. The control voltage Vc is used to drive the VCO 26 to adjust the frequency of the wobble clock WobbleCLK. For example, if the rising edge of the output signal S5 is formed before the rising edge of the output signal S4, the phase-frequency detector 22 is triggered to generate the control signal DN to lower the control voltage Vc. That is, the phase-frequency detector 22 generates the control signal DN to reduce the frequency of the wobble clock WobbleCLK to delay the generating timing of the rising edge of the output signal S5. Therefore, when the phase of the output signal S5 leads the phase of the output signal S4, signal S5 is delayed. When the rising edge of the output signal S4 is formed, the phase-frequency detector 22 triggers an control signal UP to generate an impulse and then resets the control signals UP and DN, thus completing a phase-adjust operation.

Conversely, if the rising edge of the output signal S4 is formed before the rising edge of the output signal S5, the PFD 22 is triggered to generate the control signal UP for raising the control voltage Vc. That is, the phase-frequency detector 22 generates the control signal UP to raise the frequency of the wobble clock WobbleCLK, thus making the next rising edge of the output signal S5 to occur earlier. Therefore, when the phase of the output signal S5 lags the phase of the output signal S4, signal S5 is expedited. When the rising edge of the output signal S5 is formed, the phase-frequency detector 22 triggers the control signal DN to generate an impulse and then resets the control signals UP and DN to complete a phase-adjust operation.

In a final operation scenario, when the output signal S4 and the output signal S5 have the same phase, the rising edges of the output signal S4 and the output signal S5 simultaneously trigger the PFD 22 to generate the impulse of the control signal UP and the impulse of the control signal DN and then reset the control signals UP and DN. Because the control signals UP and DN are respectively utilized for raising and reducing the control voltage Vc and the durations of the control signals UP and DN are the same, the control voltage Vc is not changed and the VCO 26 still outputs current wobble clock WobbleCLK. At last, the ADIP decoder 28 can execute an XOR logic arithmetic on the output signal S2, which corresponds to the wobble signal Wobble and the wobble clock WobbleCLK, to obtain the logic values of the phase-modulated part of the wobble signal. The logic values are used to determine whether the wobble signal Wobble stores a sync unit, a data unit, or an ADIP.

As mentioned above, the wobble clock WobbleCLK is generated according to the wobble signal Wobble. However, the wobble signal Wobble comprises a phase-modulated part. Therefore, if the PFD 22 only outputs the signal S4 directly according to the wobble signal Wobble to drive the output signal synchronous with the output signal S4, and because the phase-modulated part of the wobble signal Wobble affects the output signal S4, output signal S4 will be unstable and cause the PFD 22 to incorrectly drive the VCO 26 to adjust the wobble clock WobbleCLK. That is to say, when the wobble clock WobbleCLK originally locks the frequency of the wobble signal Wobble, and when the phase-modulated part of the wobble signal Wobble affects the output signal S4, the frequency of the wobble clock WobbleCLK becomes unstable due to the output signal S4. Therefore, the wobble clock WobbleCLK has to relock the frequency of the non-phase-modulated part of the wobble signal Wobble.

In order to combat this problem from occurring, the optical disc drive 10 uses the protection circuit 29 to generate a protection signal P1 according to the output signal S3 of the wobble signal Wobble. This means that the protection circuit 29 can detect the time duration that the phase-modulated 8 wobbles of the wobble signal Wobble affect the output signal S3, and simultaneously continue to output a protection signal P1 corresponding to a logic value (ex:1) to the PFD 22. When the PFD 22 receives the protection signal P1, the PFD 22 stops outputting control signals UP and DN such that the loop filter 24 still outputs the current voltage Vc. With regard to the VCO 26, the control voltage corresponds to a certain voltage level, while the frequency of the wobble clock WobbleCLK corresponds to a certain value. In other words, when the protection circuit 29 detects the unstable part of the output signal S3, the protection circuit 29 outputs the protection signal P1 to protect the wobble clock WobbleCLK so that it is not affected by the phase-modulated part of the wobble signal.

The ADIP decoder 28 decodes the output signal S2 to output the ADIP stored in the wobble signal Wobble through phase modulation according to the wobble clock WobbleCLK. Therefore, when the wobble clock WobbleCLK is synchronous to the non-phase-modulated part of the wobble signal Wobble and the ADIP decoder 28 can successfully decode the wobble signal Wobble to generate needed ADIP, the ADIP decoder 28 is able to predict the occurrence of the phase-modulated part of the wobble signal Wobble, which affects the PFD 22. For example, according to the DVD+R and DVD+RW standard, every two frame corresponds to 93 wobbles, where 8 wobbles store the ADIP through phase modulation and the other 85 wobbles are non-phase-modulated signals. Therefore, the ADIP decoder 28 first obtains the ADIP from the 8 phase-modulated wobbles, and after 85 wobbles, the ADIP decoder 28 obtains another ADIP from another group of 8 phase-modulated wobbles. In other words, the ADIP decoder 28 can predict that the 8 wobbles of the phase modulated part of wobble signal Wobble occur 85 wobbles after the last wobble of the previous group. The ADIP decoder 28 can output a protection signal P2 to the PFD 22 before the phase-modulated 8 wobbles affects the PFD 22. That is, the ADIP decoder 28 can trigger the protection signal P2 to correspond to a logic value (ex:1) until the phase-modulated 8 wobbles pass. The protection signal P1 and the protection signal P2 have the same function. This means that when the PFD 22 receives the protection signal P2, the PFD 22 stops outputting control signals UP and DN, such that the loop filter 24 still outputs the same current control Vc, and the frequency of the wobble clock WobbleCLK corresponds to a fixed value because the control voltage corresponds to a fixed voltage level.

Figure 2:
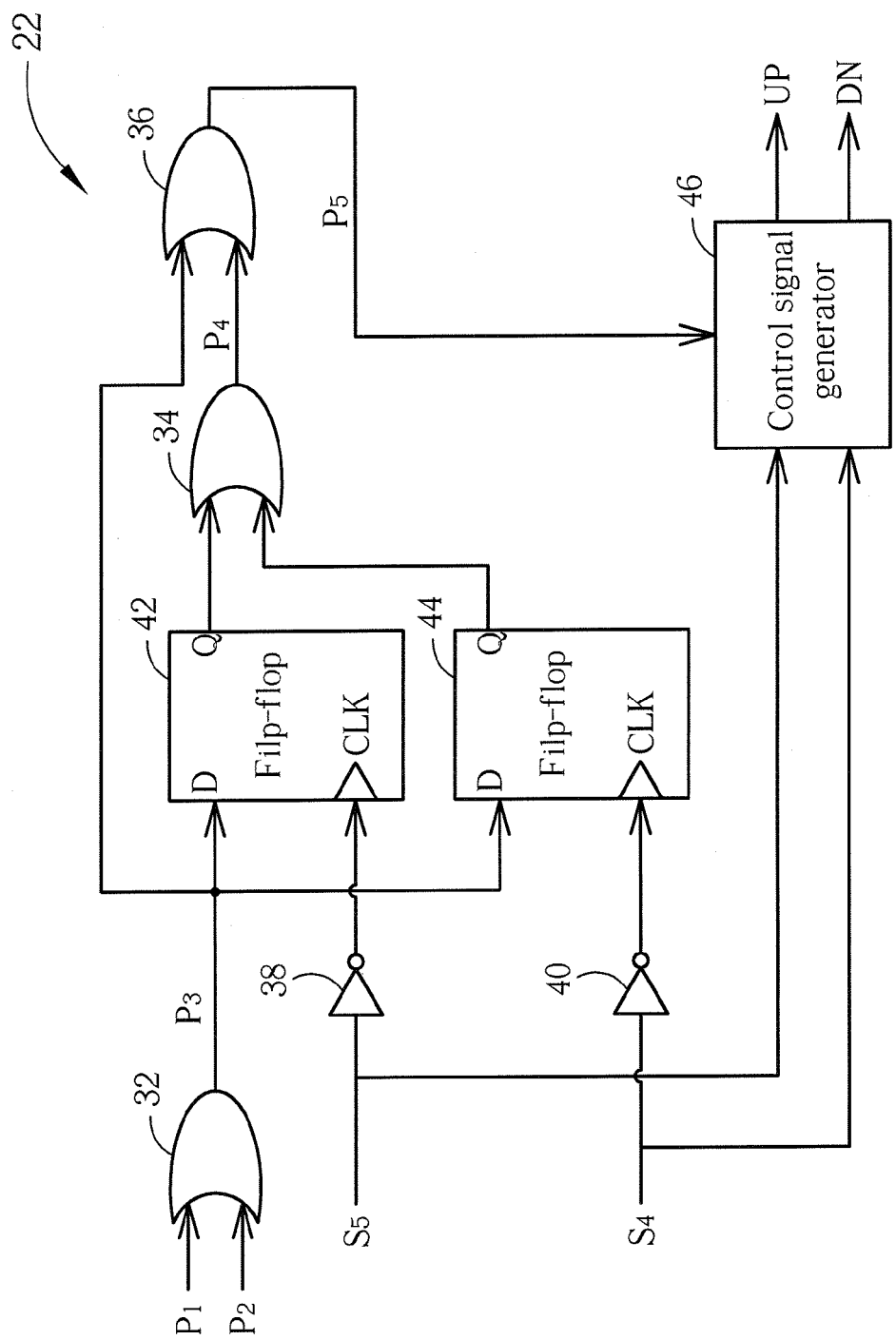
FIG. 2 is a block diagram of the phase-frequency detector of an optical disc drive shown in FIG. 1.
Figure 3:
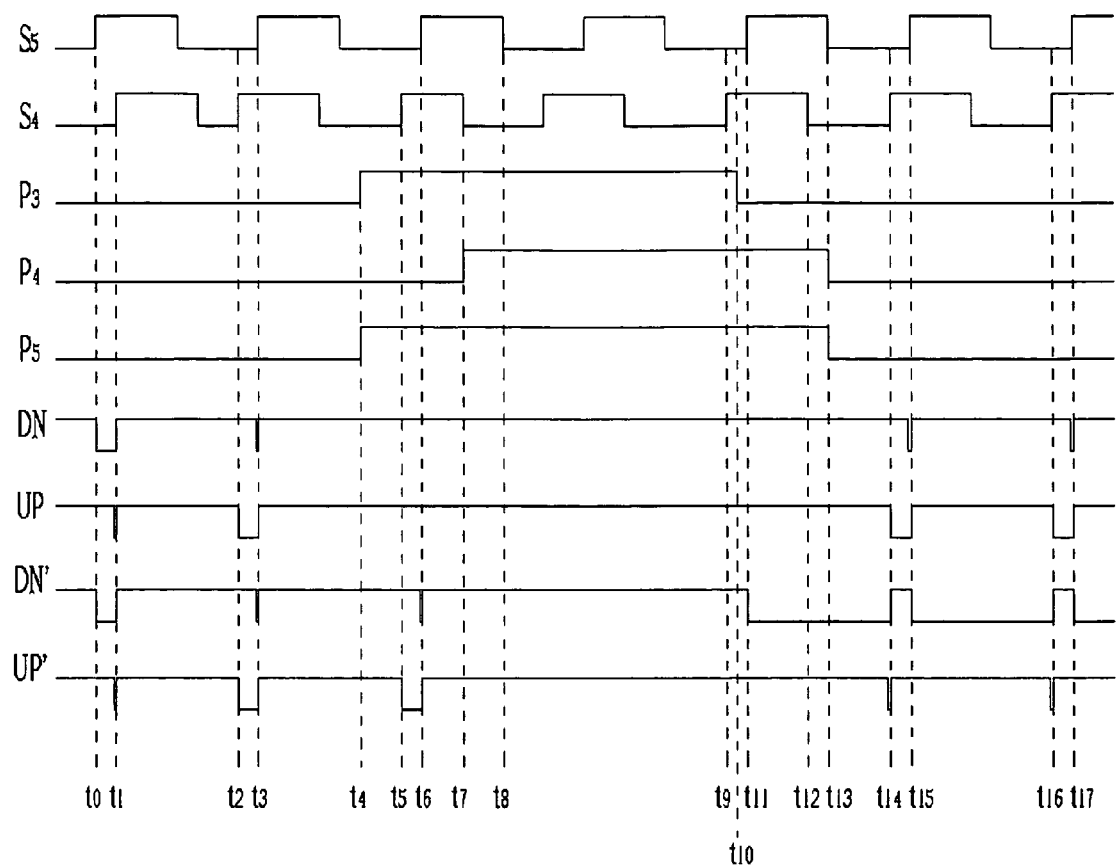
FIG. 3 is an operation diagram of the phase-frequency detector shown in FIG. 2.
Figure 2:
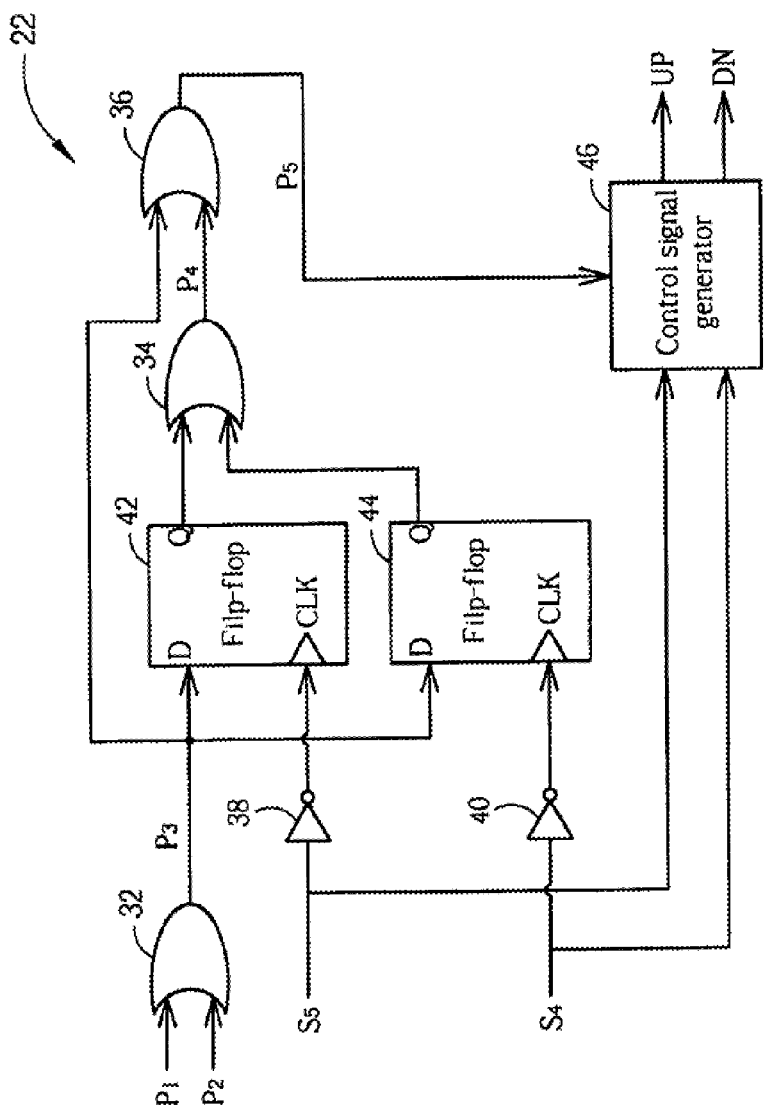

As mentioned above, the PFD 22 in this embodiment prevents the wobble clock WobbleCLK from being affected by the phase-modulated part of the wobble signal Wobble according to the protection signals P1 and P2. That is, the PFD 22 utilizes a protection mechanism to ensure the wobble clock WobbleCLK to accurately be synchronous to the non-phase-modulated part of the wobble signal Wobble. Please refer to FIG. 2 in conjunction with FIG. 3. FIG. 2 is a block diagram of the phase-frequency detector 22 shown in FIG. 1. FIG. 3 is an operation diagram of the phase-frequency detector 22 shown in FIG. 2. As shown in FIG. 2, the PFD 22 comprises a plurality of OR logic gates 32, 34, and 36, a plurality of inverters 38 and 40, a plurality of flip-flops 42 and 44, and a control signal generator 46. The operation of the PFD 22 is illustrated as follows, first the protection signal P1 from the protection circuit 29 and the protection signal P2 from the ADIP decoder 28 are executed through an OR logic arithmetic by an OR gate 32 to generate a protection signal P3. In general, before the ADIP decoder can utilize the wobble clock WobbleCLK to obtain the ADIP successfully, the PFD 22 mainly utilizes the protection signal P1 from the protection circuit 29 to prevent the wobble clock WobbleCLK from being affected by the wobble signal Wobble; however, after the VCO 26 generates needed wobble clock WobbleCLK, because the ADIP decoder can predict the timing of phase-modulated part of the wobble signal, the PFD 22 mainly utilizes the protection signal P2 from the ADIP decoder 28 to prevent the wobble clock WobbleCLK from being affected by the wobble signal Wobble. Therefore, the PFD 22 utilizes an OR gate 32 to output a protection signal P3 so that both the protection signals P1 and P2 can protect the wobble clock.

Then the protection signal P3 is inputted into the data input ends D of the flip-flops 42, 44. When the clock ends CLK of the flip-flops 42, 44 are triggered by a rising edge, the data input ends D of the flip-flops 42, 44 transfer the logic value, which is held in the data input ends D, to the data output ends Q. The data output ends Q hold the logic value from the input ends D. In this embodiment, the logic values of output signals S4, S5 are inverted by inverters 38, 40 and are then inputted into the clock ends CLK of the flip-flops 42, 44. This means that when the output signals S4, S5 correspond to a falling edge, the flip-flops 42, 44 transfers the logic values held by the data input ends D to the data output ends Q. As shown in FIG. 3, at time t4, the protection signal P3 from OR gate 32 has a transition from a low logic level to a high logic level (rising edge), and the output signal S4 has a transition from a high logic level to a low logic level (falling edge) until time t7. Therefore, for the flip-flop 44, the flip-flop 44 transfers the logic value of the data input end D to the data output end Q because the clock end CLK is triggered by the rising edge. That is, the data output end Q of the flip-flop 44 corresponds to a low logic level before time t7, and corresponds to a high logic level at time t7. After the data output end Q of the flip-flop 44 drives a input end of the OR gate 34 to correspond to a high logic level, the protection signal P4 from the OR gate 34 has a transition from a low logic level to a high logic level at time t7. Similarly, at time t8, the output signal S5 has a transition from a high logic level to a low logic level (falling edge); therefore, for flip-flop 42, the flip-flop 42 transfers the logic value held by the data input end D to the data output end Q because the clock end CLK is triggered by a rising edge. That is, the data output end Q of the flip-flop 44 corresponds to a low logic level before time t8, and corresponds to a high logic level at time t8. Because the OR gate 34 is used to execute an OR logic arithmetic, when the data output end Q drives another input end of the OR gate 34 to correspond to a high logic level, the protection signal P4 from OR gate 34 still corresponds to a high logic level.

In addition, at time t10, the protection signal P3 from the OR gate 32 has a transition from a high logic level to a low logic level (falling edge), and the output signal S4 has a transition from a high logic level to a low logic level (falling edge) at time t12. Therefore, for the flip-flop 44, the flip-flop 44 transfers the logic value held by the data input end D to the data output end Q because the clock end CLK is triggered by a rising edge. That is, the data input end Q of the flip-flop 44 corresponds to a high logic level before time t12, and corresponds to a low logic level at time t12. When the data output end Q of the flip-flop 44 drives an input end of the OR gate 34 to correspond to a low logic level, because the data output end Q of the flip-flop 42 still corresponds to a high logic level, the protection signal P4 from OR gate 34 still corresponds to a high logic level at time t12. However, at time t13, the output signal S5 has a transition from a high logic level to a low logic level (falling edge), therefore, for flip-flop 42, the flip-flop 42 transfers the logic value held by the data input end D to the data output end Q because the clock end CLK is triggered by a rising edge. That is, the data output end Q of the flip-flop 42 corresponds to a high logic level before time t13, and corresponds to a low logic level at time t13. Because the OR gate 34 is used to execute an OR logic arithmetic, after the data output end Q of the flip-flop 42 also drives another input end of the OR gate 34 to correspond to a low logic level, the protection signal S4 from the OR gate 34 has a transition from a high logic level to a low logic level.

In this embodiment, the protection signals S3, S4 are further executed through an OR logic arithmetic by the OR gate 36 to generate a protection signal P5. As shown in FIG. 3, the protection signal P3 corresponds to a high logic level between time t4 to t10, and the protection signal P4 corresponds to a high logic level between time t7 to t13. Therefore, the protection signal P5 corresponds to a high logic level between time t4 to t13. The OR gate 36 simultaneously transfers the protection signal P5 to the control signal generator 46. The control signal generator 46 is used to generate corresponding control signals UP, DN according to the phase difference between the input signal S4 and the input signal S5. Therefore, the control signal generator 46 can control the VCO 26 to adjust the frequency of the wobble clock WobbleCLK. As shown in FIG. 3, the output signal S5 forms a rising edge at time t0, however, the output signal S4 forms a rising edge at time t1. That is, the phase of the output signal S5 leads the phase of the output signal S4, therefore, at time to, the control signal generator 46 triggers a control signal DN from a high logic level to a low logic level, and at time t1, the control signal generator 46 triggers the control signal UP to generate an impulse and simultaneously resets the control signal DN. Similarly, the output signal S4 forms a rising edge at time t2, however, the output signal S5 forms a rising edge at time t3. That is, the phase of the output signal S4 leads the phase of the output signal S5. Therefore, at time t2, the control signal generator 46 triggers the control signal UP from a high logic level to a low logic level, and at time t3, the control signal generator 46 triggers the control signal DN to generate an impulse and simultaneously resets the control signal UP.

Because the protection signal P5 corresponds to a high logic level between time t4 to time t13. That is, a protection mechanism is enabled between time t4 to t13 for preventing the wobble clock WobbleCLK from being affected by the phase-modulated part of the wobble signal Wobble. Therefore, the control signal generator 46 does not trigger control signals UP, DN to change from a high logic level to a low logic level between time t4 to time t13 so that the control voltage Vc is unchanged. After time t13, the output signal S4 forms a rising edge at time t14, however, the output signal S5 forms a rising edge at time 15. This means that the phase of the output signal S4 leads the phase of the output signal S5, therefore, at time t14, the control signal generator 46 triggers the control signal UP to change form a high logic level to a low logic level, and at time t15, the control signal generator 46 triggers the control signal DN to generate an impulse and simultaneously resets the control signal UP. Similarly, because the protection signal P5 corresponds to a low logic level and the protection mechanism is not enabled after time t13, the control signal generator 46 can successfully triggers the control signal UP to change from a high logic level to a low logic level at time t16, and triggers the control signal DN to generate an impulse at time 17 and simultaneously resets the control signal UP.

In this embodiment, the OR gate 34 is used for delaying the disable timing of the protection mechanism to ensure that the PFD 22 operates normally. For example, the protection signal P3 has a transition from a high logic level to a low logic level at time t10. As shown in FIG. 3, the time t10 is between time t9 and time t11, where the output signal S4 forms a rising edge at time t9 and the output signal S5 forms a rising edge at time t11. Therefore, if the protection signal P3 is directly used for driving the control signal generator 46 instead of utilizing the OR gate 34, for the control signal generator 46, which triggers a control signal DN' to change from a high logic level to a low logic level at time t11, however, the output signal S4 forms a rising edge until time t14, therefore, the control signal generator 46 triggers a control signal UP' to generate an impulse at time t14 and simultaneously resets the control signal DN'. Similarly, the output signal S5 forms a rising edge at time t11, therefore the control signal generator 46 triggers the control signal DN' to have a transition from a high logic level to a low logic level at time t15, and the output signal S4 forms a rising edge until time t16, therefore the control signal generator 46 triggers the control signal UP' to generate an impulse and simultaneously resets a control signal DN'. As shown in FIG. 3, the output signal S4 and the output signal S5 correspond to a phase difference between time t9 to time t11, and the phase of the output signal S4 leads the phase of the output signal S5. However, after the protection mechanism enabled by the protection signal P3 is disabled, because the reset time of the protection signal P3 is between the time t9 and time t11, the output signal S4 and the output signal S5 correspond to a phase difference between time t11 to time t14 and the phase of the output signal S5 contrarily leads the phase of the output signal S4. In other words, because of the reset time of the output signal P3, the PFD 22 may operate irregularly. Therefore, in this embodiment, the PFD 22 utilizes the OR gate 34 to drive the protection signal P3 to reset from a high logic level to a low logic level (protection signal P4) after both the output signals S4, S5 form falling edges so that the above-mention reversed phase leading phenomenon is avoided.

Additionally, in this embodiment, the OR gate 36 is used for recovering the enabling time of the protection mechanism to ensure that the PFD 22 can operate normally. For example, the protection signal P3 corresponds to a high logic level between time t4 to time t10. That is, the control signal generator 46 ideally enables the protection mechanism at time t4 to prevent the wobble clock WobbleCLK from being affected by the phase-modulated part of the wobble signal Wobble. However, if the protection signal P4 is directly used for driving the control signal generator 46 instead of utilizing the OR gate 36, for the control signal generator 46, the protection mechanism is enabled at time t7. In other words, the control signal generator 46 triggers the control signals UP', DN' to adjust the phase difference between the output signal S5 and the output signal S4 between time t5 to t6, therefore, the wobble clock WobbleCLK may be adjusted incorrectly so that the wobble clock WobbleCLK is affected by the phase-modulated part of the wobble signal Wobble. Therefore, the PFD 22 utilizes the OR gate 36 so that the protection mechanism is enabled (the protection signal PS) when the protection signal P3 is triggered. Finally, the above-mentioned problem where the control signal generator 46 incorrectly adjusts the phase difference between the output signals S4 and S5, is avoided.

As mentioned above, the flip-flops 42, 44 (not considering the operation of the inverters 38, 40) and the control signal generators 46 are all rising-edge-triggered devices. In addition, the triggered time (t7) and the reset time (t13) of the protection signal P4 are controlled by the falling edges of the output signals S4, S5 because of the inventers 38, 40. The control signal generator 46 has to generate the control signals UP, DN according to the output signals S4, S5. However, in the optical disc drive 10 according to the present invention, the triggered time of the protection signal P4 can be directly controlled by the rising edges of the output signals S4, S5, and the control signal generator 46 can generate the control signals UP, DN according to the falling edges of the output signals S4, S5. That means that the circuit structure shown in FIG. 2 needs to be adjusted, in other words, the output signals S4, S5 are directly inputted into the clock ends CLK of the flip-flops 42, 44 instead of passing the inverters 38, 40. Further, the output signals S4, S5 need to be processed by the inverters 38, 40 and then inputted into the control signal generator 46.

In contrast to the prior art, the present invention optical disc drive (DVD+R disc drive or DVD+RW disc drive) is utilized in a clock generator with a protection mechanism, which can delay a reset time of a protection signal so that the protection mechanism can prevent the phase-frequency detector from wrongly determining the phase relationship between the wobble clock and the wobble signal. The optical disc drive in the present invention utilizes the protection mechanism to adjust the protection signal for the clock generator to generate needed wobble clock quickly. Furthermore, the optical disc drive in the present invention utilizes the protection mechanism to adjust the protection signal so that the clock generator can stably hold the needed clock signal. To sum up, the optical disc drive has better efficiency when executing data burning (data writing).

Those skilled in the art will readily observe that numerous modifications and alterations of the device and method may be made while retaining the teachings of the invention. Accordingly, the above disclosure should be construed as limited only by the metes and bounds of the appended claims.

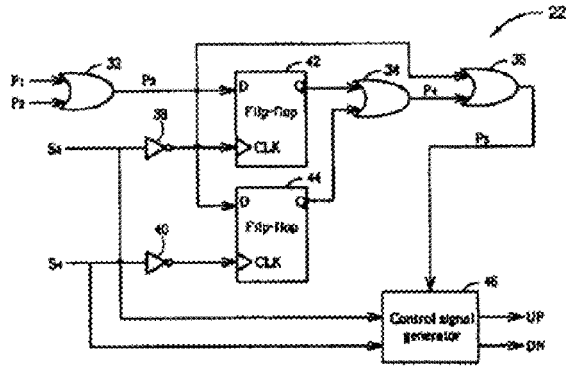

What is claimed is:

1. A phase-frequency detector for adjusting a target clock signal and an input signal to the same phase comprising:
   a first logic gate for receiving a first protection signal and a second protection signal, and for outputting a third protection signal;
   a first flip-flop electrically connected to the first logic gate, the first flip-flop for receiving the third protection signal, and for outputting the third protection signal as a first output signal when triggered by the target clock signal;
   a second flip-flop electrically connected to the first logic gate, the second flip-flop for receiving the third protection signal, and for outputting the third protection signal as a second output signal when triggered by the input signal;
   a second logic gate electrically connected to the first flip-flop and the second flip-flop, the second logic gate for receiving the first output signal and the second output signal, and for outputting a fourth protection signal; and
   a third logic gate electrically connected to the second logic gate, the third logic gate for receiving the third protection signal and the fourth protection signal, and for outputting a fifth protection signal;
   wherein a level of the fifth protection signal is used to determine whether to compare the phase of the input signal and the phase of the target clock signal.

2. The phase-frequency detector of claim 1, wherein each of the first logic gate, the second logic gate, and the third logic gate is an OR gate.

3. The phase-frequency detector of claim 1, wherein the first flip-flop and the second flip-flop are both D-type flip-flops.

4. The phase-frequency detector of claim 1, wherein the first flip-flop and the second flip-flop are both falling-edge-triggered D-type flip-flops.

5. The phase-frequency detector of claim 1 further comprising: a control signal generator connected to the target clock signal, the input signal and the fifth protection signal, the control signal generator for determining whether or not to compare the phase of the input signal and the phase of the target clock signal according to the logic level of the fifth protection signal.

6. The phase-frequency detector of claim 5, wherein when the fifth protection signal corresponds to a first logic level, the control signal generator determines to stop the comparison of the phase of the input signal and the phase of the target clock signal.

7. The phase-frequency detector of claim 5, wherein when the fifth protection signal corresponds to a second logic level, the control signal generator determines to compare the phase of the input signal with the phase of the target clock signal to output a voltage control signal for adjusting the target clock signal and the input signal to the same phase.

8. The phase-frequency detector of claim 1, further comprising:
   a first inverter electrically connected to a triggered end of the first flip-flop, the first inverter for inverting the target clock signal before the target clock signal is inputted to the triggered end of the first flip-flop;
   a second inverter electrically connected to a triggered end of the second flip-flop, the second inverter for inverting the input signal before the input signal is inputted to the triggered end of the second flip-flop.

9. The phase-frequency detector of claim 1, wherein the phase-frequency detector is utilized in an optical disc system.

10. The phase-frequency detector of claim 8, wherein the input signal is a wobble signal of an optical disc, and the target clock signal is a wobble clock signal corresponding to the wobble signal in the optical disc system.

11. A phase-frequency detecting method for adjusting a target clock signal synchronous to an input signal, the phase-frequency detecting method comprising:
   utilizing a first protection signal and a second protection signal for outputting a third protection signal;
   outputting the third protection signal to form a first output signal when triggered by the target clock signal;
   outputting the third protection signal to form a second output signal when triggered by the input signal;

utilizing the first output signal and the second output signal for outputting a fourth protection signal;

utilizing the third protection signal and the fourth protection signal for outputting a fifth protection signal; and determining whether or not to compare the phase of the input signal and the phase of the target clock signal according to a level of the fifth protection signal.

12. The phase-frequency detecting method of claim 11, wherein the step of determining whether or not to compare the phase of the input signal and the phase of the target clock signal further comprises:

stopping the comparison of the phase of the input signal and the phase of the target clock signal, when the fifth protection signal corresponds to a first logic signal.

13. The phase-frequency detecting method of claim 11, wherein the step of determining whether or not to compare the phase of the input signal and the phase of the target clock signal further comprises:

comparing the phase of the input signal with the phase of the target clock signal; and outputting a voltage control signal for adjusting the target clock signal to the same phase as the input signal, when the fifth protection signal corresponds to a second logic level.

14. The phase-frequency detecting method of claim 13, wherein the step of outputting the third protection signal to form a first output signal further comprises:

outputting the third protection signal to form the first output signal, when the target clock signal has a transition from a high logic level to a low logic level.

15. The phase-frequency detecting method of claim 13, wherein the step of outputting the third protection signal to form a second output signal further comprises:

outputting the third protection signal to form the second output signal, when the input signal is transformed from the high logic level to the low logic level.

16. The phase-frequency detector of claim 13, wherein the input signal is a wobble signal from an optical disc, and the target clock signal is a wobble clock signal corresponding to the wobble signal in the optical disc system.

17. A phase-frequency detector for adjusting a target clock signal and an input signal to the same phase comprising:

means for receiving a first protection signal and a second protection signal, and for outputting a third protection signal;

first means for receiving the third protection signal and for outputting the third protection signal as a first output signal when triggered by the target clock signal;

second means for receiving the third protection signal and for outputting the third protection signal as a second output signal when triggered by the input signal;

means for receiving the first output signal and the second output signal and for outputting a fourth protection signal;

means for receiving the third protection signal and the fourth protection signal, and for outputting a fifth protection signal;

wherein a level of the fifth protection signal is used to determine whether to compare the phase of the input signal and the phase of the target clock signal.

18. The phase-frequency detector of claim 17 further comprising:

a control means connected to the target clock signal, the input signal and the fifth protection signal, the control means for determining whether or not to compare the phase of the input signal and the phase of the target clock signal according to the level of the fifth protection signal.

19. The phase-frequency detector of claim 18, wherein when the fifth protection signal corresponds to a first logic level, the control means determines to stop the comparison of the phase of the input signal and the phase of the target clock signal.

20. The phase-frequency detector of claim 18, wherein when the fifth protection signal corresponds to a second logic level, the control means determines to compare the phase of the input signal with the phase of the target clock signal to output a voltage control signal for adjusting the target clock signal and the input signal to the same phase.

21. The phase-frequency detector of claim 17, wherein the input signal is a wobble signal of an optical disc, and the target clock signal is a wobble clock signal corresponding to the wobble signal in the optical disc system.

* * * * *

UNITED STATES PATENT AND TRADEMARK OFFICE
CERTIFICATE OF CORRECTION

| | |
|---|---|
| PATENT NO. | : 7,447,290 B2 |
| APPLICATION NO. | : 10/709026 |
| DATED | : November 4, 2008 |
| INVENTOR(S) | : Yuan-Kun Hsiao |

It is certified that error appears in the above-identified patent and that said Letters Patent is hereby corrected as shown below:

The title page showing the illustrative figure should be deleted to be replaced with the attached title page.

The drawing sheet, consisting of Fig. 2, should be deleted to be replaced with the drawing sheet, consisting of Fig. 2, as shown on the attached page.

In the Drawings:
On Sheet 2 of 3, in FIG. 2, Box 42, line 1, delete "Filp-flop" and insert -- Flip-flop --, therefor.

On Sheet 2 of 3, in FIG. 2, Box 44, line 1, delete "Filp-flop" and insert -- Flip-flop --, therefor.

In column 2, line 43, after "addition," delete "A" and insert -- a --, therefor.

In column 7, line 50, delete "to," and insert -- t0, --, therefor.

In column 8, line 35, delete "t11," and insert -- t15, --, therefor.

In column 9, line 10, delete "PS)" and insert -- P5) --, therefor.

Signed and Sealed this

Tenth Day of March, 2009

JOHN DOLL
*Acting Director of the United States Patent and Trademark Office*

(12) United States Patent
Hsiao

(10) Patent No.: US 7,447,290 B2
(45) Date of Patent: Nov. 4, 2008

(54) APPARATUS OF PHASE-FREQUENCY DETECTOR

(75) Inventor: Yuan-Kun Hsiao, Taipei Hsien (TW)

(73) Assignee: Tian Holdings, LLC, Wilmington, DE (US)

(*) Notice: Subject to any disclaimer, the term of this patent is extended or adjusted under 35 U.S.C. 154(b) by 830 days.

(21) Appl. No.: 10/789,826

(22) Filed: Apr. 7, 2004

(65) Prior Publication Data
US 2005/0025275 A1 Feb. 3, 2005

Related U.S. Application Data

(60) Provisional application No. 60/461,578, filed on Apr. 10, 2003.

(51) Int. Cl.
*H03D 3/24* (2006.01)

(52) U.S. Cl. .......... 375/375; 375/215; 375/373; 375/376; 327/3; 327/5; 327/7; 327/156; 369/44.13; 369/44.26

(58) Field of Classification Search .......... 375/326, 375/362, 371, 373, 375–376, 315, 354; 327/113, 327/3, 5, 7, 12, 156; 455/130, 214; 369/44.13, 369/44.26, 44.28, 47, 275.4
See application file for complete search history.

(56) References Cited

U.S. PATENT DOCUMENTS

| 4,999,824 A | 3/1991 | Fuji et al. |
| 5,478,666 A | 12/1995 | Ito et al. |
| 5,689,482 A | 11/1997 | Iida |
| 6,088,307 A * | 7/2000 | Fushimi et al. ....... 369/44.13 |
| 6,285,219 B1 * | 9/2001 | Pauls ....................... 327/3 |
| 6,333,902 B1 | 12/2001 | Shim |
| 6,345,023 B1 | 2/2002 | Fushimi et al. |
| 6,587,417 B2 | 7/2003 | Okamoto |
| 6,661,752 B2 | 12/2003 | Eom |
| 6,754,147 B2 | 6/2004 | Hsu |

(Continued)

FOREIGN PATENT DOCUMENTS

CN 1373474 A 10/2002

(Continued)

*Primary Examiner*—Shuwang Liu
*Assistant Examiner*—Hirdepal Singh
(74) *Attorney, Agent, or Firm*—Perkins Coie LLP

(57) ABSTRACT

An apparatus of phase-frequency detector for adjusting wobble clock signal and wobble signal in the same phase, comprising: a first logic gate, receiving a first protection signal and a second protection signal and outputting a third protection signal according to a logic operation; a first flip-flop, coupled to the first logic gate, outputting the third protection signal as a first output signal when the wobble clock trigger; a second flip-flop, coupled to the first logic gate, outputting the third protection signal as a second output signal when the wobble signal trigger; a second logic gate, coupled to the first and the second flip-flop, outputting a fourth protection signal according to a logic operation; a third logic gate, coupled to the second logic gate, receiving the third and the fourth protection signal, and outputting a fifth protection signal according to a logic operation; and a control signal generator, receiving the wobble clock, the input signal, and the fifth protection signal and determining whether adjusting the phase of the wobble signal and the wobble clock according to the logic level of the fifth protection signal.

21 Claims, 3 Drawing Sheets